United States Patent [19]

Portmann

[11] Patent Number: 4,730,114

[45] Date of Patent: Mar. 8, 1988

[54] CIRCUIT ARRANGEMENT FOR ELECTRONICALLY GENERATING A RESISTOR SETTING AND AUDIO SYSTEM BASED THEREON

[75] Inventor: Juerg Portmann, Basel, Switzerland

[73] Assignee: Audio System DB AG, Basel, Switzerland

[21] Appl. No.: 825,936

[22] Filed: Feb. 4, 1986

[30] Foreign Application Priority Data

Feb. 21, 1985 [DE] Fed. Rep. of Germany ....... 3505983

[51] Int. Cl.$^4$ ............................................ G02B 27/00
[52] U.S. Cl. ...................................... 250/551; 307/311
[58] Field of Search ................ 250/208, 551; 307/311; 455/602

[56] References Cited

U.S. PATENT DOCUMENTS 3,772,514  11/1973  Sunderland .......................... 250/551
4,056,719  11/1977  Waaben .................................. 307/311
4,228,323  10/1980  Feiner et al. .......................... 455/602
4,313,225  1/1982  Carbrey et al. ........................ 250/551

Primary Examiner—David C. Nelms
Attorney, Agent, or Firm—Schwartz, Jeffery, Schwaab, Mack, Blumenthal & Evans

[57] ABSTRACT

A circuit arrangement for causing a resistor to assume a selectable value in which the resistor is photosensitive and optically isolated from the control circuitry used to drive a photodiode and so to generate the light which determines its resistance. The control circuitry includes a second photosensitive resistor arranged in a feedback loop and further arranged to be illuminated by a second photodiode in parallel with the first photodiode. The resistance value is selected by supplying the control circuit with an analog voltage signal which may be developed at the tap of a potentiometer either directly, or indirectly after conversion to a digital signal, storage, and eventual reconversion into an analog signal.

17 Claims, 5 Drawing Figures

Fig.5
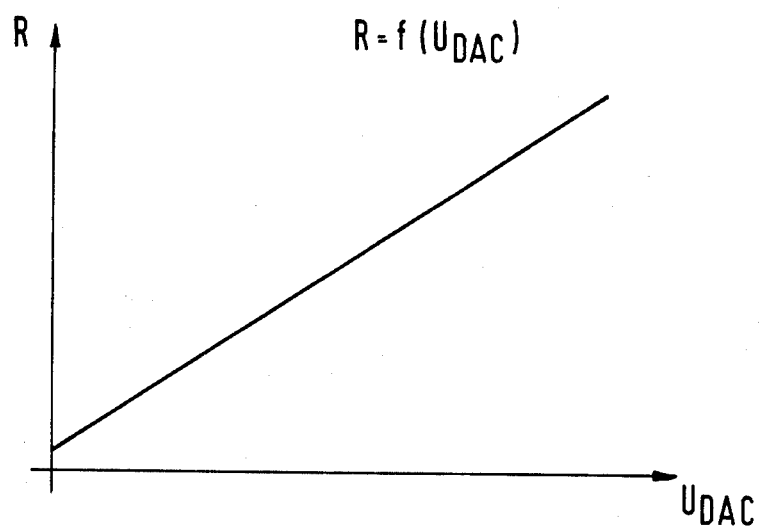
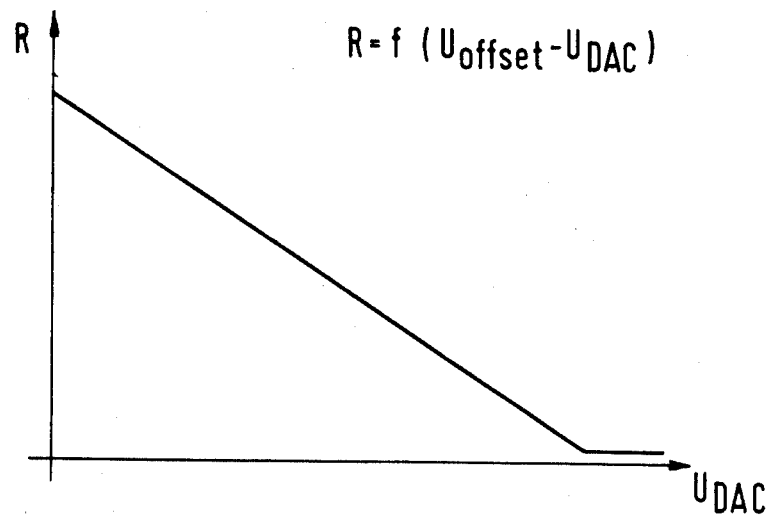

4,730,114

CIRCUIT ARRANGEMENT FOR ELECTRONICALLY GENERATING A RESISTOR SETTING AND AUDIO SYSTEM BASED THEREON

BACKGROUND OF THE INVENTION

The present invention pertains to a circuit arrangement for electronically generating resistor setting corresponding to a predetermined voltage. The invention pertains especially to an audio system incorporating such a circuit arrangement.

Variable electrical quantity settings are made, as a rule, by means of variable resistors. Especially where complex settings for a large number of variable resistors are concerned, it is often desired that a setting, once made, be immediately reproducible, even if other settings must be made in the meantime. Storing, in digital form, the voltage drop between one tap and one terminal on the variable resistor as the signal value for the resistance, and therefore the resistor setting, is a known method. To this end, an analog signal having a magnitude corresponding to this voltage drop is converted by an analog/digital converter into a digital signal which is storable in conventional digital memories. Reconversion of the stored signal into an analog signal is customarily effected via a digital/analog converter which produces an analog voltage at its output. This voltage can be presented to one input of a voltage-controlled amplifier which amplifies a voltage applied to it depending on the voltage at the output of the digital/analog converter, and correspondingly affects the resistor setting.

The use of voltage-controlled amplifiers, however, is very uneconomical and expensive. Also, especially when a number of such amplifiers are connected in series, such as in audio systems, such use results in unacceptable noise, restricted dynamics for the processed signals, and distortions due to nonlinearities.

For complex systems with a large number of setting regulators, for example a 28-channel audiomixer, the storage of instantaneous resistance values is thus not practically possible.

A further disadvantage to the known circuit arrangement consists in that a change in the resistor setting when the output of the digital/analog converter is being read at high frequency by a microprocessor causes a stepwise change in the output voltage which, because of the proportion of harmonics contained in audio systems, results in interfering noises unless particularly elaborate measures are taken.

SUMMARY OF THE INVENTION

The object of the invention is thus to devise a circuit arrangement of the type mentioned in the introduction, which neither audibly distorts the signal to be affected by the resistor setting nor is accompanied by a degradation of the signal/noise ratio or dynamics.

This object is attained by the invention in that a regulating circuit with two inputs is provided, the input signals to which circuit match when regulated, such that the predetermined voltage forms one of the input signals and the other input signal can be obtained through a light-dependent resistor; in that the output signal from the regulating circuit controls a light-emitting diode associated with the light-dependent resistor, forming together with it a light-emitting-diode/resistor pair; and in that the output signal from the regulating circuit controls the light-emitting diode of a further light-emitting diode/resistor pair, the resistor in which is thus adjusted to match the predetermined voltage.

In other words, the object is attained by providing a circuit arrangement including means for generating a first control voltage, means for generating a second control voltage, and for varying the second control voltage in accordance with the resistance of an included first element whose resistance varies in accordance with an intensity of light incident upon the first element, means, responsively connected to the means for generating the first control voltage and the means for generating and varying the second control voltage, for generating a control output in accordance with a difference between the first and second control voltages, first light generating means, responsive to the control output, for generating light whose intensity varies with the magnitude of the control output, second light generating means, responsive to the control output, for generating light whose intensity varies with the magnitude of the control output, and a second element, arranged to be illuminated by the second light generating means, whose resistance varies in accordance with the intensity of light incident upon the second element, and so on the intensity of light generated by the second light generating means, the first element being arranged to be illuminated by the first light generating means so that the resistance of the first element varies in accordance with the intensity of the light generated by the first light generating means.

BRIEF DESCRIPTION OF THE DRAWINGS

The invention shall be explained in greater detail using the exemplary embodiments shown in the drawings section, in which;

FIG. 5 shows a graphic representation of the regulation provided by the two partial circuits in FIG. 4.

DETAILED DESCRIPTION OF THE PREFERRED EMBODIMENTS

Figure 1:
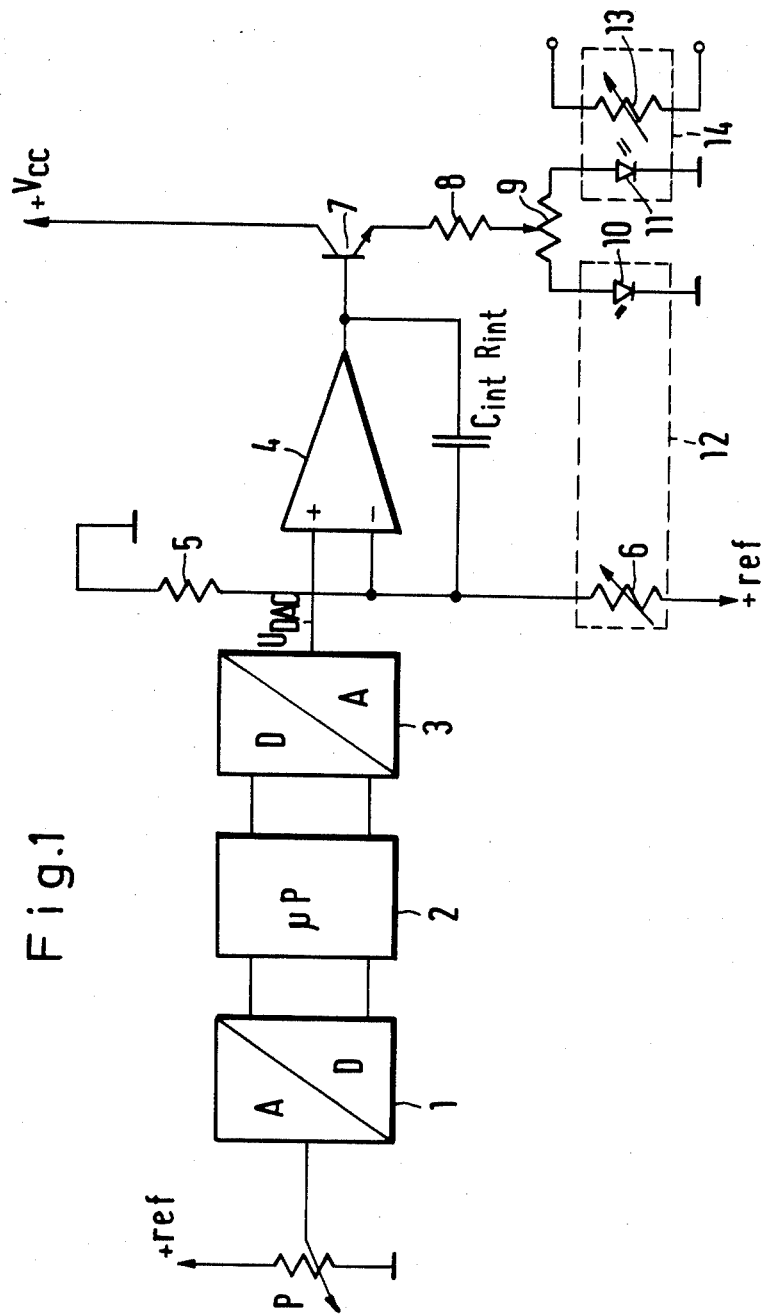
FIG. 1 shows an audio system with a potentiometer whose setting is reproduced electronically.

The invention is based on the use of conventional light-emitting-diode/resistor pairs, which are also called LDRs (light-dependent resistors). The resistance value depends on the intensity of the current flowing through the light-emitting diode. Since the light-emitting diode and the resistor are coupled by the light emitted by the light emitting diode, the light-emitting diode and the resistor are electrically isolated from each other. According to the invention, a resistor in such a light-emitting-diode/resistor pair is then combined with a fixed resistor to form a voltage divider in which the point at which the two resistors are connected is connected to one input of a regulating circuit. The other input receives the signal with the predetermined voltage, hence generally the output signal from a digital-/analog converter. The regulating circuit, preferably constructed with an operational amplifier, adjusts the light from the light-emitting diode in such a way that the resistor which depends on the light-emitting diode takes on a value which causes the signal at the second input to the operational amplifier to become equal to the predetermined voltage. The resistance of the resistor controlled by the light-emitting diode is thus directly proportional to the /predetermined/ voltage. According to the invention, a second light-emitting-diode/resistor pair is provided, in which the light-emitting diode is triggered by the current controlling the light-emitting diode of the first light-emitting-diode/resistor pair. The resistor belonging to the second light-emitting-diode/resistor pair thus assumes the same value as the resistor of the first light-emitting-diode/resistor pair in the regulating circuit, and is furthermore completely electrically isolated from the regulating circuit. Therefore, to process the signal with the desired resistor setting, only the ohmic resistor of the second light-emitting-diode/resistor pair is used. This ohmic resistor, being a purely passive feature of the circuit, can cause neither distortion nor perceptible noise. A further advantage of the use of light-emitting-diode/resistor pairs consists in that there is a certain delay in matching the resistance to the control current, which delay exerts an integrating effect. The step-function voltage which appears at the output of the digital/analog converter when the resistor setting is dynamically altered and thereby smoothed into a continuous curve. Noises arising from harmonics can thus be avoided.

The invention makes it possible for the first time to reproduce a resistor setting in an ohmic resistor that is electrically isolated from the regulating circuit.

Since the delay in the light-emitting-diode/resistor pair can lead to oscillation in the regulating circuit, it is advantageous that the regulating circuit contain an integrated circuit whose time constant matches the delay in the light-emitting-diode/resistor pair.

The resistance characteristic curve of light-emitting-diode/resistor pairs as a function of the control current is virtually identical, but can be parallel-displaced.

A balancing resistor, to whose tap the current controlling the light-emitting-diode is applied, can be provided to obtain the same resistance for the resistor in the regulating circuit and the resistor on the output terminals of the circuit arrangement. This makes it possible to accomplish the relative parallel displacement of the resistors' characteristics that may possibly be necessary.

In an alternative embodiment, the current controlling the second light-emitting diode can be adjustable via an adjustable linear amplifier, which likewise makes parallel displacement possible.

In a simple embodiment of the circuit according to the invention, the second input signal can be taken from the tap of a voltage divider consisting of a fixed resistor and the light-dependent resistor.

In a preferred alternative embodiment, a stabilized current source is connected to the light-dependent resistor, and the second input signal is taken from between the stabilized current source and the light-dependent resistor. Since the current remains stable, this circuit arrangement ensures that the variation in voltage proportionate to the resistance will be linear, so that linear regulation is obtained.

It is also possible to apply the input signals to one input of the regulating circuit while a reference voltage, generally ground, is attached to the other input. A particular kind of regulation can be obtained if an offset voltage of reverse polarity is added to the two input voltages. In this case, the resistance at the output of the circuit is inversely proportional to the voltage which forms the first input signal.

The circuit arrangement according to the invention takes on very great significance as part of an audio system with regulators setting a large number of variable resistors, a memory stage for the voltages which drop instantaneously across the variable resistors, and a stage to reproduce the resistances corresponding to the adjusted variable resistors. According to the invention, the voltage which drops across a variable resistor in such an audio system is read by a microprocessor and stored a digital form; reproduction is controlled by the microprocessor and effected via a digital/analog converter provided with a regulating circuit with two inputs, the input signals of which circuit match when regulated, such that the predetermined voltage forms one of the input signals and the other input signal can be obtained through a light-dependent resistor; the output signal from the regulating circuit controls a light-emitting diode associated with the light-dependent resistor, forming together with it a light-emitting-diode/resistor pair; and the output signal from the regulating circuit controls the light-emitting diode of a further light-emitting-diode/resistor pair, the resistor in which is thus adjusted to correspond to the predetermined voltage.

With reference now to the drawings, FIG. 1 shows a potentiometer P, both ends of which are connected to the two poles of a reference voltage, +ref and ground. The setting of potentiometer P is thus given as an analog voltage which appears at the potentiometer tap. This analog voltage is converted into a digital signal via an analog-digital converter 1, which signal is read by a microprocessor 2 and stored.

When the stored potentiometer setting is to be reproduced, microprocessor 2 reads the digital signal from the memory and feeds it to a digital/analog converter 3, resulting in an analog voltage $U_{DAC}$ at its output. This voltage is applied to the non-inverting input of an operational amplifier 4 whose inverting input is connected to the junction at which a fixed resistor 5 and a light-dependent resistor 6 form a voltage divider 5, 6. The voltage divider 5, 6 is connected across the terminals of the reference voltage +ref. The output of the operational amplifier 4 is connected to the inverting input through an integrating capacitor $C_{int}$ in series with a resistor $R_{int}$.

The output signal from the operational amplifier 4 is fed through a transistor 7 wired as an emitter-follower and through a series resistor 8 connected to the emitter of the transistor 7 to the tap on a balancing resistor 9. The anodes of light-emitting diodes 10, 11 are connected to the two terminals of the balancing resistor 9; the cathodes of the diodes are grounded. Light-emitting diode 10 together with light-dependent resistor 6 forms light-emitting-diode/resistor pair 12, while light-emitting diode 11 together with another light-dependent resistor 13 forms light-emitting-diode/resistor pair 14.

The operating principle behind the circuit shown consists in that light-emitting diode 10 controls its accompanying light-dependent resistor 6 in such a way that the amount of voltage on both inputs to the operational amplifier 4 is the same. Since light-emitting diode 11 in light-emitting-diode/resistor pair 14 is triggered by the same current flowing through the emitter-follower 7, the resistor 13 of this light-emitting-diode/resistor pair 14 assumes the same value as the resistor 6 of the first light-emitting-diode/resistor pair 12. Any parallel displacements in the current/resistance characteristic of the two light-emitting-diode/resistor pairs 12 and 14 relative to each other can be compensated by equalizing the balancing resistor 9. The integrating circuit $C_{int}$, $R_{int}$ sets the regulating constants of the regulating circuit so that resistors 6, 13 adjust to the currents flowing through their accompanying light-emitting-diodes 10, 11 with the same delay, thus preventing the occurrence of oscillations in the regulating circuit.

Figure 2:
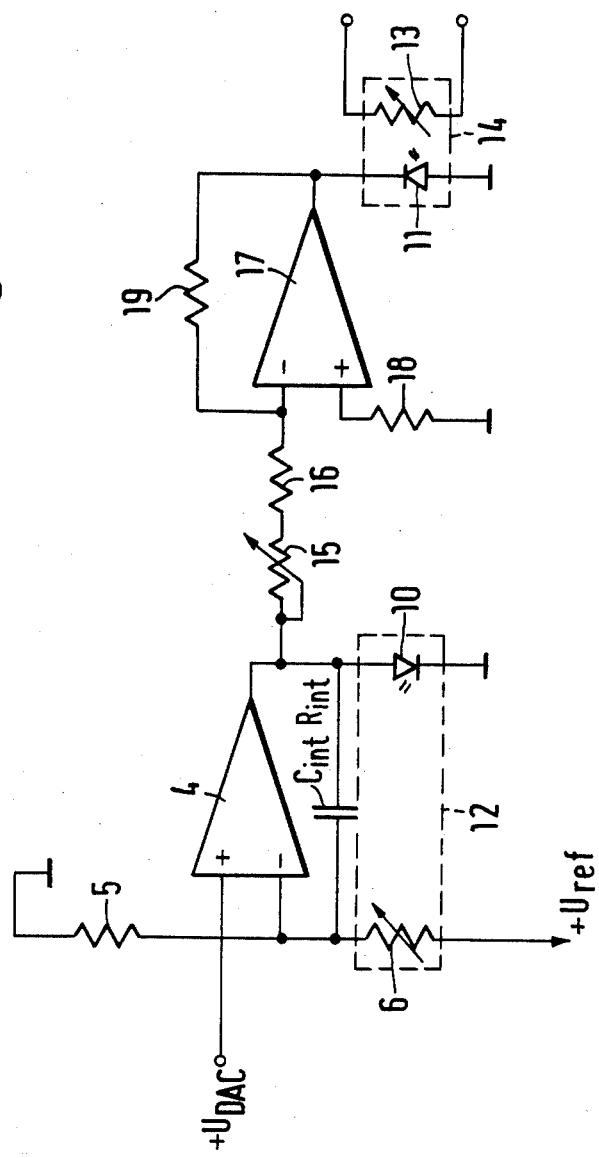
FIG. 2 shows a second embodiment of the circuit shown in FIG. 1.

Matching the two resistors 6, 13 relative to each other can also be accomplished by a linear amplifier in place of the balancing resistor 9. This embodiment is shown in FIG. 2, in which the components identical to the components in FIG. 1 have the same reference numbers. The output of operational amplifier 4 in this case is connected to a variable resistor 15 and a fixed resistor 16 wired in series, the other end of which resistor 16 is connected to the inverting input of an operational amplifier 17. The non-inverting input of the operational amplifier 17 is grounded through a fixed resistor 18. The output of the operational amplifier 17 is feedback-coupled to its inverting input through a fixed resistor 19 to linearize the amplifier characteristics. The output of operational amplifier 17 is further connected to the cathode of light-emitting diode 11 in the first light-emitting-diode/resistor pair 14, the anode of which is grounded. Light-emitting diode 11 controls resistor 13 in the same manner as in FIG. 1.

The parts of the circuit controlled by the setting regulator which is connected to potentiometer P can be connected to the terminals of resistor 13. The stored setting for the setting regulator is reproduced reliably by resistor 13. The electrical signal, preferably an audio signal, which normally is influenced by a potentiometer connected to the setting regulator, can be influenced in the same manner by resistor 13, without resulting in an increase in noise, distortion of the signal, or restriction of dynamic range, since the signal is influenced exclusively by an ohmic resistor which is electrically isolated from the regulating circuit.

Figure 3:
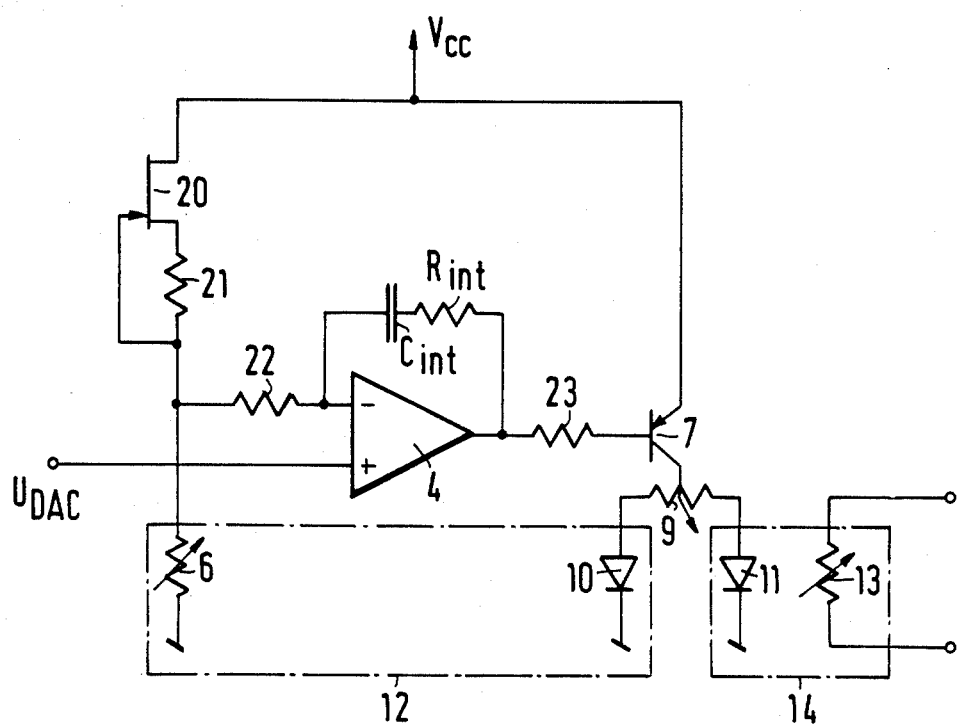
FIG. 3 shows an alternative circuit arrangement with a stabilized current source.

FIG. 3 shows a circuit arrangement in which the light-dependent resistor is connected to the voltage source $V_{cc}$ through a stabilized current source consisting of a field effect transistor 20 and resistor in series 21. The end of resistor 21 that is not connected to the field effect transistor 20 is connected to the gate of the field effect transistor 20. This circuit arrangement, which keeps the current flowing through light-dependent resistor 6 constant, ensures that the resistance and voltage have a strictly linear relationship, since current I is constant according to Ohm's law, $R=(E/I)$. The point at which the stabilized current source 20, 21 and the light-dependent resistor 6 are joined is connected to the inverting input of the operational amplifier 4 through a resistor. The transistor 7 in this case is a pnp transistor. All other parts of the circuit are identical and thus have identical reference numbers.

Figure 4:
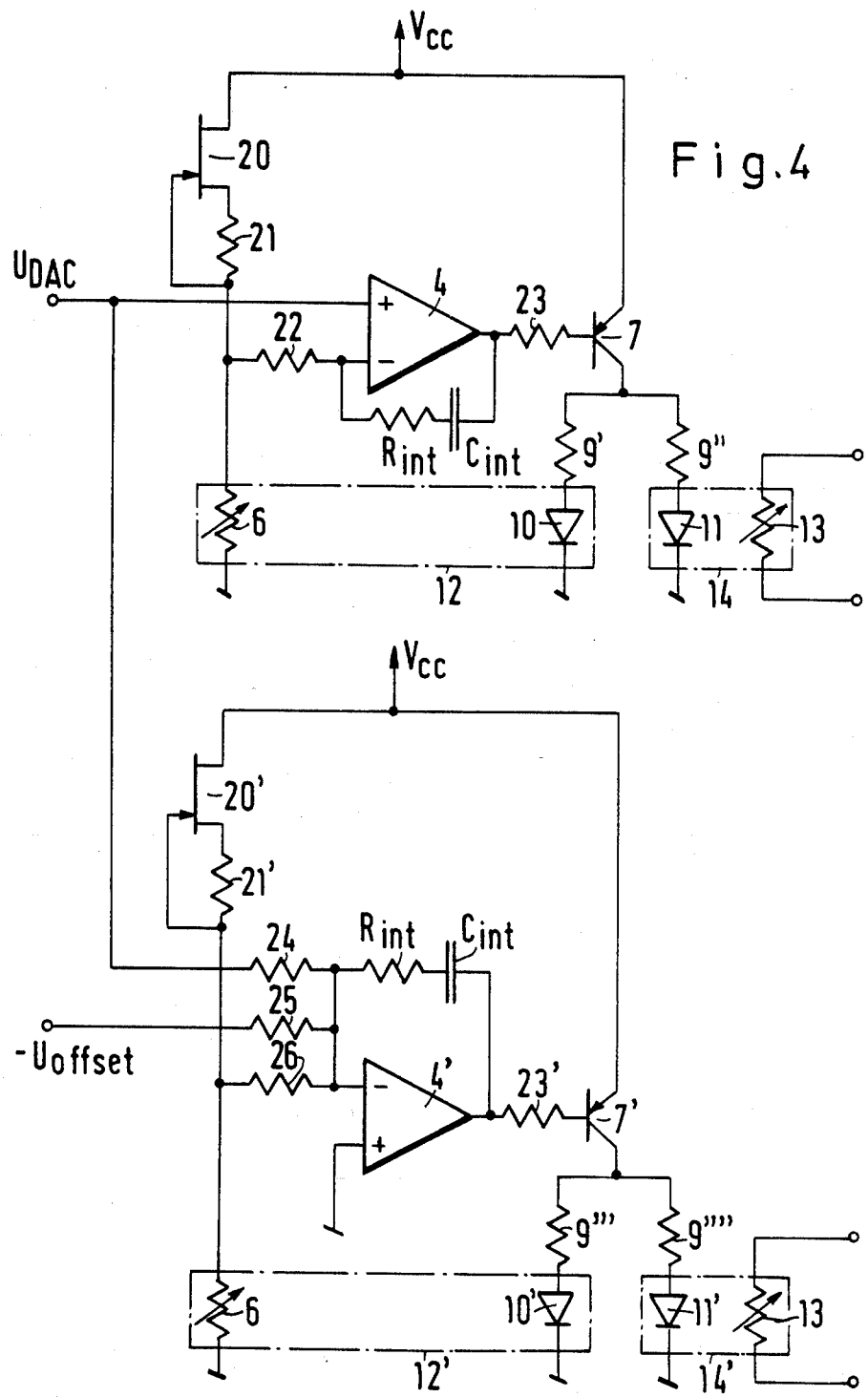
FIG. 4 shows a circuit arrangement with part of the circuit as shown in FIG. 3 and another part of the circuit in which the input signals are added and applied to a common input to the regulating circuit.

FIG. 4 shows a circuit arrangement whose upper part is identical with the circuit arrangement in FIG. 3. The lower part of the circuit arrangement is also to a great extent identical to the circuit as shown in FIG. 3. The sole difference consists in that the input voltages $U_{DAC}$ and the voltage across light-dependent resistor 6' are added and applied to the inverting input of operational amplifier 4' through neutralizing resistors 24, 26, while the positive input of the operational amplifier is grounded. In addition to the two added input voltages, a negative offset voltage $-U_{offset}$ is applied through a further neutralizing resistor 25. While a linear relationship between the input voltage $U_{DAC}$ and resistor R obtains for output resistor 13 in the upper part of the circuit, as shown in FIG. 5a, the resistance for resistor 13' in the lower part of the circuit depends on the difference between the offset voltage $U_{offset}$ and the input voltage $U_{DAC}$. This results in reduction of the resistance of light-dependent resistors 6' and 13' as the input voltage $U_{DAC}$ increases, yielding inverse proportionality. For input voltage $U_{DAC}=0$, the resistance is determined solely by the offset voltage. The resistance is minimal when the input voltage equals the offset voltage. It is thus simple to generate different regulating characteristics while applying constant input voltages.

One of ordinary skill in the art will readily perceive that the present invention would be useful in many applications other than that used as an example above. The invention should therefore not be perceived as limited to the exemplary application, but instead to extend to include all applications and variations within the scope of the following claims.

What is claimed is:

1. A circuit arrangement comprising:
   means for generating a first control voltage;
   means for generating a second control voltage, and for varying said second control voltage in accordance with the resistance of an included first element whose resistance varies in accordance with an intensity of light incident upon said first element;
   first light generating means for illuminating said first element with light so that the resistance of said first element varies in accordance with the intensity of the light generated by said first light generating means;
   control output generating means, responsively connected to said means for generating said first control voltage and said means for generating and varying said second control voltage, for generating a control output in accordace with a difference between said first and second control voltages, said control output controlling said first light generating means so as to vary the resistance of the first element to such an amount that the difference between said first and second control voltages becomes zero;
   second light generating means, responsive to said control output, for generating light whose intensity varies with the magnitude of said control output; and
   a second element, arranged to be illuminated by said second light generating means, whose resistance varies in accordance with the intensity of light incident upon said second element, and so on the intensity of light generated by said second light generating means.

2. The circuit arrangement of claim 1, wherein said control output generating means comprises an operational amplifier including an inverting input, a non-inverting input, and an output terminal, and wherein said first control voltage is applied to said non-inverting input, said second control voltage is applied to said inverting input, and said control output appears at said output terminal.

3. The circuit arrangement of claim 1 wherein said means for generating a second control voltage comprises a voltage divider including a serial combination of a fixed resistance and said first element across a reference voltage source, said second control voltage appearing at the junction of said fixed resistance and first element.

4. The circuit arrangement of claim 1 wherein said means for generating a second control voltage comprises a serial combination of a stabilized current source and said first element, said second control voltage appearing at the junction of said stabilized current source and first element.

5. The circuit arrangement of claim 1 wherein said first and second light generating elements each comprise a light-emitting diode.

6. The circuit arrangement of claim 1 further comprising means responsive to said control output for compensating for a time delay in operation of said first light generating means and first element by integrating said control output to generate a compensating signal, said control output generating means being further responsive to said compensating signal.

7. The circuit arrangement of claim 1 further comprising a current buffer interposed between said control output generating means and said first and second light generating means.

8. The circuit arrangement of claim 1 wherein said means for generating a first control voltage comprises a potentiometer and digital means, connected to an output of said potentiometer, for reading and storing a value indicative of magnitude of voltage appearing at said potentiometer output, and for generating said first control voltage in accordance with said stored value.

9. The circuit arrangement of claim 8 wherein said digital means comprises:
   an analog-to-digital converter for converting the output of said potentiometer into a first digital signal having said value indicative of said magnitude of voltage appearing at said potentiometer output;
   a memory for storing an indication of said digital signal;
   a microprocessor for retrieving said indication and generating a second digital signal representative of said first digital; and
   a digital-to-analog converter for converting said second digital signal into said first control voltage.

10. The circuit arrangement of claim 1 further comprising means interposed between said control output generating means and said first and second light generating means for compensating parallel displacements in the current/resistance characteristics of said first light generating means and said first element as compared to said second light generating means and said second element.

11. The circuit arrangement of claim 10 wherein said parallel displacement compensating means comprises a balancing potentiometer having a tap and two terminals, said tap being arranged to receive said control output and each of said terminals being respectively connected to one of such first and second light generating means.

12. The circuit arrangement of claim 1 further comprising linear amplifying means, interposed between said control output generating means and said second light generating means, for amplifying said control output to generate an amplified control output, and for applying said amplified control output to said second light generating means.

13. The circuit arrangement of claim 12 wherein said linear amplifying means comprises a feedback operational amplifier.

14. The circuit arrangement of claim 12 wherein said linear amplifying means includes means adjusting the degree of amplification effected by said linear amplifying means.

15. The circuit arrangement of claim 1 further comprising:
   means for generating a third control voltage, and for varying said third control voltage in accordance with the resistance of an included third element whose resistance varies with an intensity of light incident on said third element;
   means, responsively connected to said first and third control voltage generating means, for generating a sum signal indicative of a weighted sum of said first and third control voltages;
   means, responsively connected to said sum signal generating means, for generating a second control output in accordance with said sum signal;
   third light generating means, responsive to said control output, for generating light whose intensity varies with the magnitude of said control output;
   fourth light generating means, responsive to said control output, for generating light whose intensity varies with the magnitude of said control output; and
   a fourth element, arranged to be illuminated by said fourth light generating means, whose resistance varies in accordance with the intensity of light incident upon said fourth element, and so on the intensity of light generated by said fourth light generating means,
   said third element being arranged to be illuminated by said third light generating means so that the resistance of said third element varies in accordance with the intensity of said light generated by said third light generating means.

16. The circuit arrangement of claim 15 further comprising means for generating a fourth control voltage, and wherein said means for generating a sum signal is further responsively connected to said fourth control voltage generating means, for generating a sum signal indicative of a weighted sum of said first, third, and fourth control voltages.

17. The circuit arrangement of claim 15 wherein said means for generating a second control output comprises an operational amplifier including an inverting input, a non-inverting input, and an output terminal, and wherein said sum signal is applied to said inverting input, a reference voltage is applied to said non-inverting input, and said second control output appears at said output terminal.

* * * * *